(12) United States Patent
Wang et al.

(10) Patent No.: US 11,404,424 B2
(45) Date of Patent: Aug. 2, 2022

(54) STATIC RANDOM ACCESS MEMORY WITH MAGNETIC TUNNEL JUNCTION CELLS

(71) Applicant: Taiwan Semiconductor Manufacturing Company Limited, Hsinchu (TW)

(72) Inventors: Ping-Wei Wang, Hsinchu (TW); Jui-Lin Chen, Taipei (TW); Yu-Kuan Lin, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/166,570

(22) Filed: Feb. 3, 2021

(65) Prior Publication Data
US 2021/0335797 A1    Oct. 28, 2021

Related U.S. Application Data

(60) Provisional application No. 63/016,420, filed on Apr. 28, 2020.

(51) Int. Cl.
*G11C 11/16* (2006.01)
*H01L 27/11* (2006.01)
(Continued)

(52) U.S. Cl.
CPC ...... *H01L 27/1104* (2013.01); *G11C 11/1655* (2013.01); *G11C 11/1657* (2013.01);
(Continued)

(58) Field of Classification Search
CPC ... H01L 27/1104; H01L 43/08; G11C 11/412; G11C 11/1657; G11C 11/1655; G11C 11/1697
(Continued)

(56) References Cited

U.S. PATENT DOCUMENTS 8,023,299 B1 * 9/2011 Gharia ............... G11C 11/16
365/49.1
8,537,597 B2 * 9/2013 Kushida ............ G11C 13/004
365/148
(Continued)

FOREIGN PATENT DOCUMENTS

CN    107657981 A    2/2018

OTHER PUBLICATIONS

Higher Performance Logic Systems for Less Power; 4 pages.
Zhao et al; Spin-MTJ based Non-Volatile Flip-Flop; Aug. 2007; 5 pages.

*Primary Examiner* — Michael T Tran
(74) *Attorney, Agent, or Firm* — Foley & Lardner LLP

(57) ABSTRACT

Disclosed herein are related to a memory cell including magnetic tunneling junction (MTJ) devices. In one aspect, the memory cell includes a first layer including a first transistor and a second transistor. In one aspect, the first transistor and the second transistor are connected to each other in a cross-coupled configuration. A first drain structure of the first transistor may be electrically coupled to a first gate structure of the second transistor, and a second drain structure of the second transistor may be electrically coupled to a second gate structure of the first transistor. In one aspect, the memory cell includes a second layer including a first MTJ device electrically coupled to the first drain structure of the first transistor and a second MTJ device electrically coupled to the second drain structure of the second transistor. In one aspect, the second layer is above the first layer.

20 Claims, 13 Drawing Sheets

(51) Int. Cl.
*G11C 11/412* (2006.01)
*H01L 43/08* (2006.01)
*H01L 27/22* (2006.01)

(52) U.S. Cl.
CPC ........ *G11C 11/1697* (2013.01); *G11C 11/412* (2013.01); *H01L 27/226* (2013.01); *H01L 43/08* (2013.01)

(58) Field of Classification Search
USPC .................................................. 365/158, 173
See application file for complete search history.

(56) References Cited

U.S. PATENT DOCUMENTS

| | | | | |
|---|---|---|---|---|
| 9,183,914 B2* | 11/2015 | Owada | ................... | G11C 11/21 |
| 9,196,337 B2* | 11/2015 | Jung | ..................... | G11C 7/065 |
| 9,311,994 B2 | 4/2016 | Di Pendina et al. | | |
| 9,349,440 B1 | 5/2016 | Ma | | |
| 9,564,209 B1* | 2/2017 | Lee | ...................... | G11C 11/413 |
| 10,706,914 B2* | 7/2020 | Tseng | ...................... | G11C 8/08 |
| 10,755,772 B1* | 8/2020 | Liu | ........................ | G11C 11/409 |
| 10,777,268 B2* | 9/2020 | Gopinath | ........... | G11C 13/0002 |
| 10,854,291 B2* | 12/2020 | Jaiswal | ................. | G11C 5/147 |
| 10,916,583 B2* | 2/2021 | Wang | ..................... | H01L 43/14 |
| 10,964,366 B2* | 3/2021 | Ohmori | ............... | G11C 11/1655 |
| 10,971,229 B2* | 4/2021 | Jaiswal | ............... | G11C 11/1675 |
| 10,991,756 B2* | 4/2021 | Lai | .......................... | H01L 43/08 |
| 11,049,563 B1* | 6/2021 | Liao | ................... | G11C 13/0004 |
| 11,075,207 B2* | 7/2021 | Sharma | ............... | H01L 27/1104 |
| 11,087,837 B2* | 8/2021 | Huynh Bao | ......... | G11C 13/003 |
| 11,101,318 B2* | 8/2021 | Kumar | .................. | H01L 27/222 |
| 2008/0225590 A1* | 9/2008 | Lamorey | ................. | G11C 11/16 365/185.05 |
| 2009/0109734 A1 | 4/2009 | Hanafi | | |
| 2010/0037001 A1* | 2/2010 | Langlois | ............... | G06F 12/0246 711/103 |
| 2010/0188891 A1* | 7/2010 | Taniguchi | ........... | G11C 14/0081 365/158 |
| 2011/0273925 A1 | 11/2011 | Yamamoto et al. | | |
| 2012/0020159 A1* | 1/2012 | Ong | .................... | G11C 14/0081 365/185.08 |
| 2012/0320658 A1* | 12/2012 | Wang | ................. | G11C 14/0054 365/148 |
| 2013/0028012 A1* | 1/2013 | Fujita | ................. | G11C 14/0054 365/158 |
| 2014/0334216 A1* | 11/2014 | Wang | ..................... | G11C 11/16 365/63 |
| 2014/0355330 A1* | 12/2014 | Endoh | ................. | G11C 15/046 365/148 |
| 2015/0332745 A1* | 11/2015 | Ohsawa | .............. | G11C 11/1693 365/148 |
| 2016/0276031 A1* | 9/2016 | Abe | ..................... | G11C 11/1657 |
| 2016/0329098 A1 | 11/2016 | Javerliac et al. | | |
| 2017/0017434 A1* | 1/2017 | Bang | ...................... | G06F 12/02 |
| 2018/0082732 A1 | 3/2018 | Luo et al. | | |
| 2018/0121212 A1 | 5/2018 | Luo et al. | | |
| 2018/0174644 A1* | 6/2018 | Sakhare | .............. | G11C 11/1673 |
| 2019/0244666 A1 | 8/2019 | Hsu | | |
| 2021/0201997 A1* | 7/2021 | Yuh | .......................... | G11C 8/16 |

* cited by examiner

Parallel Magnetic State

Rp

Anti-Parallel Magnetic State

Rap

1100

```
┌─────────────────────────────────────────────────────────────┐
│  Couple a first bit line and a second bit line to a first node │
│         and a second node of a memory cell                  │
│                          1110                                │
└─────────────────────────────────────────────────────────────┘
                              ↓
┌─────────────────────────────────────────────────────────────┐
│   Apply a first voltage to the first node through the first │
│                          bit line                            │
│                          1120                                │
└─────────────────────────────────────────────────────────────┘
                              ↓
┌─────────────────────────────────────────────────────────────┐
│         Apply a second voltage to the second node            │
│                          1130                                │
└─────────────────────────────────────────────────────────────┘
                              ↓
┌─────────────────────────────────────────────────────────────┐
│          Apply a reference voltage to a common node          │
│                          1140                                │
└─────────────────────────────────────────────────────────────┘
                              ↓
┌─────────────────────────────────────────────────────────────┐
│  Decouple the first bit line and the second bit line from the │
│              first node and the second node                 │
│                          1150                                │
└─────────────────────────────────────────────────────────────┘
```

STATIC RANDOM ACCESS MEMORY WITH MAGNETIC TUNNEL JUNCTION CELLS

CROSS-REFERENCE TO RELATED APPLICATION

This application claims priority to and the benefit of U.S. Provisional Application No. 63/016,420, filed Apr. 28, 2020, which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flowchart of a method of writing data to a memory cell with MTJ devices, in accordance with some embodiments.

DETAILED DESCRIPTION

Figure 1:
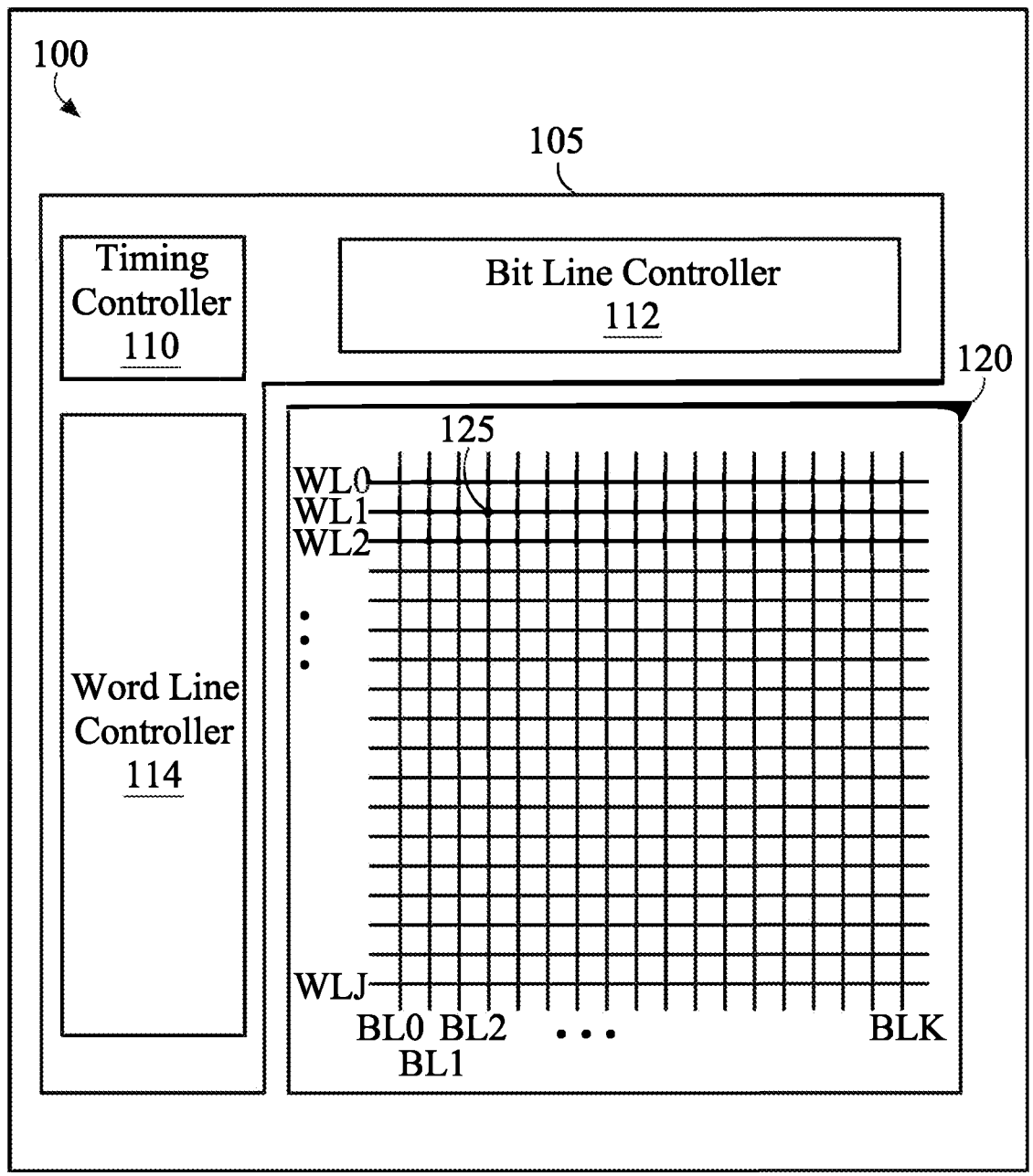
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a storage circuit or a memory cell includes cross-coupled transistors and magnetic tunnel junction (MTJ) devices. In one aspect, the cross-coupled transistors are disposed on a first layer and the MTJ devices are disposed on a second layer above the first layer. The cross-coupled transistors may include a first transistor and a second transistor. The first transistor and the second transistor may be any transistors (e.g., metal oxide semiconductor field effect transistor (MOSFET), fin FET (FinFET), gate all around FET (GAAFET), etc.). The first transistor and the second transistor may be N-type transistors. A first drain structure of the first transistor may be electrically coupled to a first gate structure of the second transistor and a second drain structure of the second transistor may be electrically coupled to a second gate structure of the first transistor. In one aspect, a first MTJ device is electrically coupled to the first drain structure of the first transistor and a second MTJ device is electrically coupled to the second drain structure of the second transistor.

Advantageously, the disclosed storage circuit or memory cell provides several benefits. In one aspect, the disclosed storage circuit or memory cell bypasses or omits P-type transistors, but instead includes or implements N-type transistors with MTJ devices in different layers in a partially or wholly overlapping manner. Accordingly, area efficiency can be achieved by obviating P-type transistors that are larger than N-type transistors. Moreover, power efficiency can be achieved, because leakage current through P-type transistors can be obviated. In addition, the MTJ devices can store bits or data without power, such that the disclosed storage circuit or memory cell can operate or function as a non-volatile memory cell.

Although various embodiments disclosed herein are described with respect to a memory cell including cross-coupled transistors and MTJ devices coupled to the cross-coupled transistors, different components may be implemented in some embodiments. For example, an amplifier or a regenerative circuit can replace the cross-coupled transistors, where different types of non-volatile memory devices or variable resistors can replace the MTJ devices.

FIG. 1 is a diagram of a memory system 100, in accordance with one embodiment. In some embodiments, the memory system 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 ... WLJ, each extending in a first direction (e.g., X-direction) and bit lines BL0, BL1 ... BLK, each extending in a second direction (e.g., Y-direction). The word lines WL and the bit lines BL may be conductive metals or conductive rails. In one aspect, each memory cell 125 is coupled to a corresponding word line WL and a corresponding bit line, and can be operated according to voltages or currents through the corresponding word line WL and the corresponding bit line BL. In one aspect, each memory cell 125 includes cross-coupled transistors and MTJ devices. Each memory cell 125 may be Static Random Access Memory (SRAM) memory cell with MTJ devices. By employing cross-coupled transistors and MTJ devices as disclosed herein, storage density and power efficiency can be improved. In some embodiments, the memory array 120 includes additional lines (e.g., select lines, reference lines, reference control lines, power rails, etc.). Detailed descriptions on configurations and operations of the memory system 100 are provided below with respect to FIGS. 2 through 10.

The memory controller 105 is a hardware component that controls operations of the memory array 120. In some embodiments, the memory controller 105 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In one example, to write data to a memory cell 125, the word line controller 114 provides a voltage or current to the memory cell 125 through a word line WL coupled to the memory cell 125, and the bit line controller 112 applies a bias voltage to the memory cell 125 through a bit line BL coupled to the memory cell 125. In one example, to read data from a memory cell 125, the word line controller 114 provides a voltage or current to the memory cell 125 through a word line WL coupled to the memory cell 125, and the bit line controller 112 senses a voltage or current corresponding to data stored by the memory cell 125 through a bit line BL coupled to the memory cell 125. In some embodiments, the memory controller 105 includes more, fewer, or different components than shown in FIG. 1.

Figure 2:
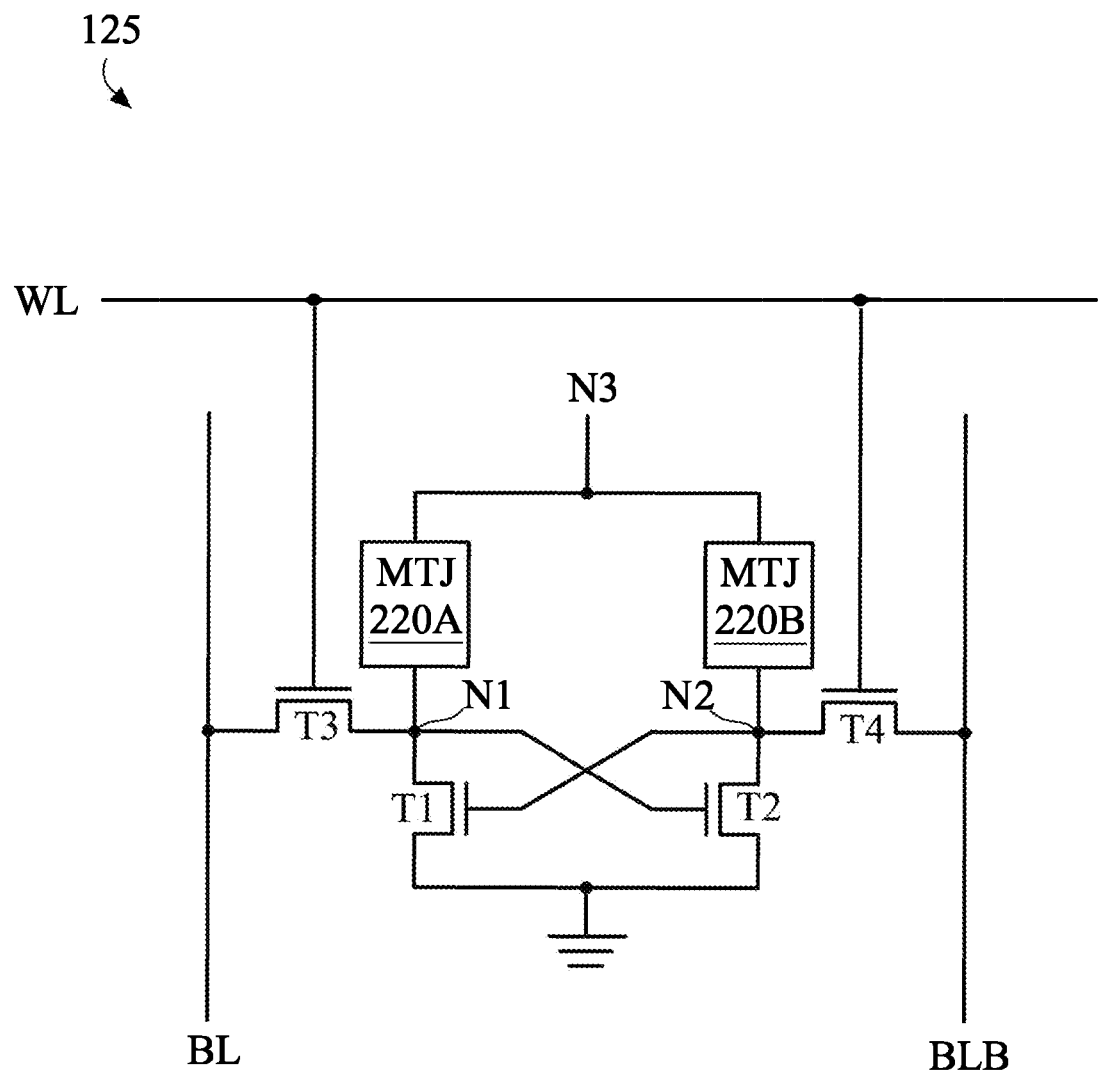
FIG. 2 is a schematic diagram of a memory cell with magnetic tunnel junction (MTJ) devices, in accordance with some embodiments.

FIG. 2 is a diagram of a memory cell 125 with MTJ devices 220A, 220B, in accordance with some embodiments. In some embodiments, the memory cell 125 includes MTJ devices 220A, 220B, and transistors T1, T2, T3, T4. These components may operate together to store a bit. In other embodiments, the memory cell 125 includes more, fewer, or different components than shown in FIG. 2.

In some embodiments, the transistors T1, T2 operate as a regenerative circuit or a positive feedback circuit. The transistor T1 and the transistor T2 may be any transistors (e.g., MOSFETs, FinFETs, GAAFETs, etc.). The transistor T1 and the transistor T2 may be N-type transistors. In one aspect, the transistors T1, T2 embodied as N-type transistors function or operate as pull-down transistors. In some embodiments, the transistors T1, T2 can be replaced by other circuits or components that perform the functionalities of the transistors T1, T2 described herein. In one configuration, the transistors T1, T2 are arranged in a cross-coupled configuration. In one aspect, a gate structure of the transistor T1 is coupled to a node N2, or a drain structure of the transistor T2. In one aspect, a gate structure of the transistor T2 is coupled to a node N1 or a drain structure of the transistor T1. In one aspect, a source structure of the transistor T1 and a source structure of the transistor T2 are coupled to each other. For example, the source structure of the transistor T1 and the source structure of the transistor T2 are coupled to a ground rail, at which a ground voltage is supplied. In this configuration, the cross-coupled transistors T1, T2 can sense a voltage difference of the voltages at the nodes N1, N2, and increase the voltage difference. For example, if a voltage at the node N1 is 0.498 V and a voltage at the node N2 is 0.497 V, the cross-coupled transistors T1, T2 can sense that the voltage at the node N1 is higher than the voltage at the node N2. In response to a higher voltage being applied to the gate structure of the transistor T2 than a voltage applied to the gate structure of the transistor T1, the transistor T2 may conduct more current than the transistor T1. By conducting more current through the transistor T2, the voltage at the node N2 may decrease to increase a voltage difference of the voltages at the nodes N1, N2. Through positive feedback, the voltage difference of the voltages at the nodes N1, N2 may increase, until one of the voltages at the nodes N1, N2 becomes, for example, the ground voltage.

In one configuration, the transistors T3, T4 operate as electrical switches or pass-gate transistors. The transistor T3 and the transistor T4 may be any transistors (e.g., MOSFETs, FinFETs, GAAFETs, etc.). The transistor T3 and the transistor T4 may be N-type transistors. In some embodiments, the transistors T3, T4 can be replaced by other circuits or components that perform the functionalities of the transistors T3, T4 described herein. In one configuration, the transistor T3 includes a gate structure electrically coupled to a word line WL, a source structure electrically coupled to a bit line BL, and a drain structure electrically coupled to the node N1 or the drain structure of the transistor T1. In one configuration, the transistor T4 includes a gate structure electrically coupled to the word line WL, a source structure electrically coupled to a bit line BLB, and a drain structure electrically coupled to the node N2 or the drain structure of the transistor T2. In this configuration, the transistor T3 may allow the bit line BL to electrically couple to or decouple from the node N1, according to a voltage applied to the word line WL. Similarly, the transistor T4 may allow the bit line BLB to electrically couple to or decouple from the node N2, according to the voltage applied to the word line WL. For example, according to a high voltage (e.g., VDD) applied to the word line WL, the transistor T3 is enabled to electrically couple the bit line BL to the node N1 and the transistor T4 is enabled to electrically couple the bit line BLB to the node N2. For another example, according to a low voltage (e.g., GND) applied to the word line WL, the transistor T3 is disabled to electrically decouple the bit line BL from the node N1 and the transistor T4 is disabled to electrically decouple the bit line BLB from the node N2.

The MTJ devices 220A, 220B are circuits that store a bit of data. The MTJ devices 220A, 220B may be embodied as non-volatile memory devices. The MTJ devices 220A, 220B may operate as variable resistors. In some embodiments, MTJ devices 220A, 220B can be replaced by other circuits or components that perform the functionalities of the MTJ devices 220A, 220B described herein. In one aspect, a resistance of the MTJ device 220 is adjusted or modified according to a voltage applied across the MTJ device 220. In one configuration, the MTJ device 220 is electrically coupled between a drain structure of a transistor and a common node N3, at which a reference voltage (e.g., ½ VDD or 0.5V) is applied. The common node N3 may be electrically coupled to or embodied as a metal rail or a power line providing a reference voltage. For example, the MTJ device 220A is electrically coupled between the drain structure of the transistor T1 and the common node N3, and the MTJ device 220B is electrically coupled between the drain structure of the transistor T2 and the common node N3. In this configuration, the MTJ devices 220A, 220B can store data according to voltages at the nodes N1, N2. For example, if a low voltage (e.g., GND) is applied to the node N1 and a high voltage (e.g., VDD) is applied to the node N2 while a reference voltage (e.g., ½ VDD or 0.5V) is applied to the node N3, the MTJ device 220A may be set or programmed to have a lower resistance than a resistance of the MTJ device 220B. For example, if the high voltage (e.g., VDD) is applied to the node N1 and the low voltage (e.g., GND) is applied to the node N2 while the reference voltage (e.g., ½ VDD or 0.5V) is applied to the node N3, the MTJ device 220A may be set or programmed to have a higher resistance than a resistance of the MTJ device 220B. Detailed descriptions on example operations of the MTJ device 220 are provided below with respect to FIGS. 3A and 3B.

In some embodiments, the memory controller 105 may provide signals (e.g., voltage and/or current) through the word line WL and the bit lines BL, BLB to write data to or read data from the memory cell 125. When writing data, the memory controller 105 may enable the transistors T3, T4 by providing a high voltage (e.g., VDD) to the word line WL. Then, the memory controller 105 may provide voltages corresponding to data to write to the nodes N1, N2 through the bit lines BL, BLB and the transistors T3, T4. According to the voltages applied through the bit lines BL, BLB, the MTJ devices 220A, 220B can be set or programmed. For example, by applying the low voltage (e.g., GND) to the node N1 and a reference voltage (e.g., ½ VDD) to the node N3 for a predetermined time period (e.g., 30 ns), the MTJ device 220A may have a parallel state Rp with a low resistance (e.g., less than 40 kΩ). For example, by applying the high voltage (e.g., VDD) to the node N2 and the reference voltage to the node N3, the MTJ device 220B may have an anti-parallel state Rap with a high resistance (e.g., larger than 80 kΩ). After enabling the transistors T3, T4 for the predetermined time period (e.g., 30 ns) to set the states of the MTJ devices 220A, 220B, the memory controller 105 may disable the transistors T3, T4 to decouple the bit lines BL, BLB from the nodes N1, N2, respectively.

When reading data, the memory controller 105 may disable the transistors T3, T4 and provide a supply voltage (e.g., VDD) to the node N3. When the transistors T3, T4 are disabled, voltages at the nodes N1, N2 may be set, according to the programmed states of the MTJ devices 220A, 220B. For example, if the MTJ device 220A has a lower resistance than the MTJ device 220B, the voltage at the node N1 can be closer to the supply voltage (e.g., VDD) than the voltage at the node N2 where the voltage at the node N2 can be closer to the ground voltage (e.g., GND) than the voltage at the node N1. For example, if the MTJ device 220B has a lower resistance than the MTJ device 220A, the voltage at the node N2 can be closer to the supply voltage (e.g., VDD) than the voltage at the node N1 where the voltage at the node N1 can be closer to the ground voltage (e.g., GND) than the voltage at the node N2. After a predetermined time period (e.g., 10 ns) for the voltages at the nodes N1, N2 to settle, the memory controller 105 may enable the transistors T3, T4 and sense voltages at the nodes N1, N2 through the bit lines BL, BLB, respectively for reading. According to the sensed voltages through the bit lines BL, BLB, the memory controller 105 may determine a programmed bit of the memory cell 125. For example, in response to the voltage sensed through the bit line BL being higher than the voltage sensed through the bit line BLB, the memory controller 105 may determine that the memory cell 125 stores a logic value '1'. For example, in response to the voltage sensed through the bit line BL being lower than the voltage sensed through the bit line BLB, the memory controller 105 may determine that the memory cell 125 stores a logic value '0'.

Advantageously, the memory cell 125 provides several benefits. In one aspect, the memory cell 125 bypasses or omits P-type transistors, but instead includes or implements N-type transistors T1, T2, T3, T4 with MTJ devices 220A, 220B. The MTJ devices 220, 220B may be disposed in different layers than the transistors N1, N2, N3, N4. Accordingly, area efficiency can be achieved by obviating P-type transistors that are larger than N-type transistors. Moreover, power efficiency can be achieved, because leakage current through P-type transistors can be obviated. In addition, the MTJ devices can store bits or data without power, such that the memory cell 125 can operate or function as a non-volatile memory cell.

Figure 3A:
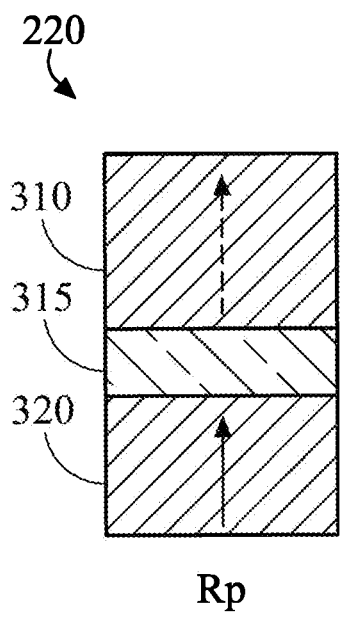
FIG. 3A is a diagram of an MTJ device in a parallel magnetic state, in accordance with some embodiments.
Figure 3B:
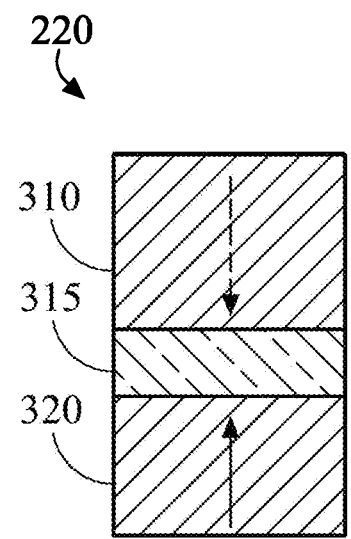
FIG. 3B is a diagram of the MTJ device in an anti-parallel magnetic state, in accordance with some embodiments.

FIG. 3A is a diagram of an MTJ device 220 in a parallel magnetic state, in accordance with some embodiments. FIG. 3B is a diagram of the MTJ device 220 in an anti-parallel magnetic state, in accordance with some embodiments.

In some embodiments, the MTJ device 220 includes a free layer structure 310, a barrier layer structure 315, and a pinned layer structure 320. The barrier layer structure 315 may separate the free layer structure 310 and the pinned layer structure 320. In one aspect, a state of the pinned layer structure 320 is fixed or not configurable, where a state of the free layer structure 310 is configurable according to a voltage across the MTJ device 220. For example, if a reference voltage (e.g., ½ VDD or 0.5V) is applied to the free layer structure 310 of the MTJ device 220 and a low voltage (e.g., GND) lower than the reference voltage is applied to the pinned layer structure 320 of the MTJ device 220 for at least a time period (e.g., 30 ns), the MTJ device 220 can be programmed to have a parallel state Rp. For example, if the reference voltage (e.g., ½ VDD or 0.5V) is applied to the free layer structure 310 structure of the MTJ device 220 and the high voltage (e.g., VDD) higher than the reference voltage is applied to the pinned layer structure 320 of the MTJ device 220 for at least a time period (e.g., 30 ns), the MTJ device 220 can be programmed to have an anti-parallel state Rap. The MTJ device 220 having the parallel state Rp may have a lower resistance than in the anti-parallel state Rap.

Figure 4:
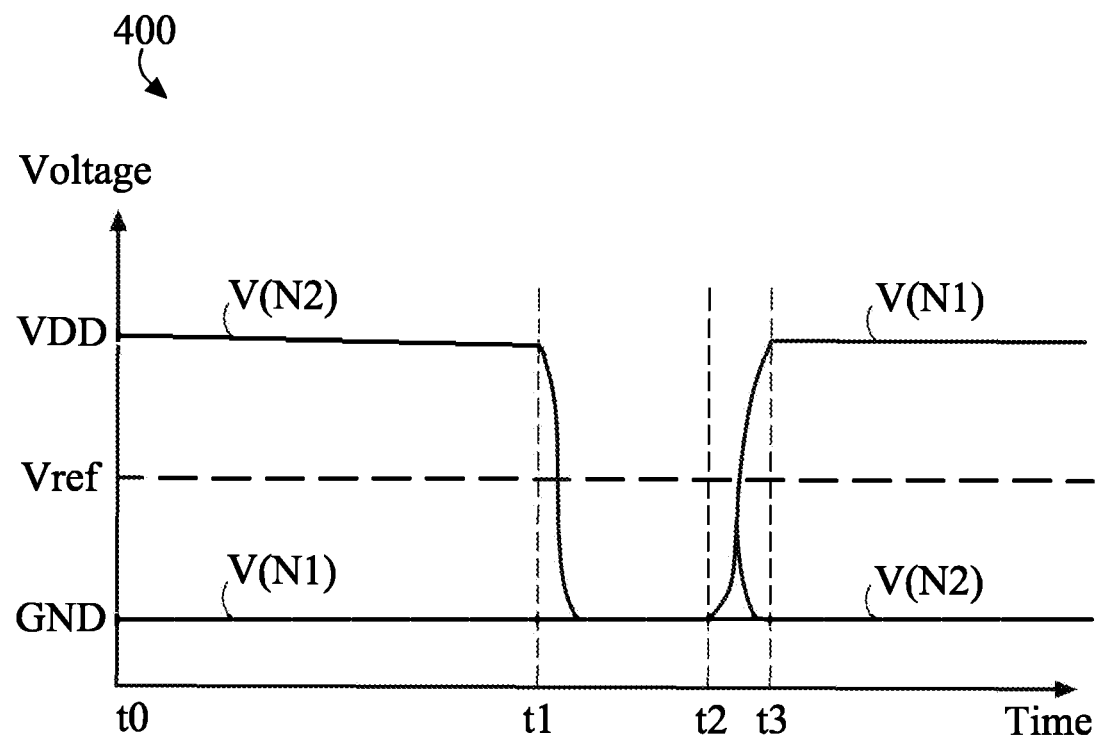
FIG. 4 is a timing diagram showing an operation of the memory cell of FIG. 2, in accordance with some embodiments.

FIG. 4 is a timing diagram 400 showing an operation of the memory cell 125 of FIG. 2, in accordance with some embodiments. In one example, between time t0 and time t1, the memory controller 105 may enable the transistors T3, T4 to write data to the memory cell 125. In one example, the memory controller 105 may enable the transistors T3, T4 by providing a high voltage (e.g., VDD) to the word line WL. Then, the memory controller 105 may provide the low voltage (e.g., GND) to the node N1 and a reference voltage Vref (e.g., ½ VDD) to the node N3 for a predetermined time period (e.g., 30 ns). According to the low voltage (e.g., GND) provided to the node N1 and the reference voltage Vref applied to the node N3 for a predetermined time period, the MTJ device 220A may have a parallel state Rp with a low resistance (e.g., less than 40 kΩ). Meanwhile, the memory controller 105 may provide the high voltage (e.g., VDD) to the node N2 and the reference voltage Vref to the node N3. According to the high voltage (e.g., VDD) provided to the node N2 and the reference voltage Vref provided to the node N3 for the predetermined time period, the MTJ device 220B may have an anti-parallel state Rap with a high resistance (e.g., less than 80 kΩ). At time t1, after setting or programming the states of the MTJ devices 220A, 220B, the memory controller 105 may disable the transistors T3, T4 to decouple the bit lines BL, BLB from the nodes N1, N2, respectively. At time t1, the memory controller 105 may discontinue providing a reference voltage to the node N3, such that the memory cell 125 may not consume power. By disabling the transistors T3, T4 and stop providing the reference voltage to the node N3, voltages at the nodes N1, N2 may become the ground voltage.

At time t2, power may be provided to the node N3 to read data stored by the MTJ devices 220A, 220B. By providing a supply voltage (e.g., VDD) to the node N3 while the transistors T3, T4 are disabled, voltages at the nodes N1, N2 may be set, according to the programmed states of the MTJ devices 220A, 220B. For example, if the MTJ device 220A has a lower resistance than the MTJ device 220B, the voltage at the node N1 can be closer to the supply voltage (e.g., VDD) than the voltage at the node N2 where the voltage at the node N2 can be closer to the ground voltage (e.g., GND) than the voltage at the node N1. For example, if the MTJ device 220B has a lower resistance than the MTJ device 220A, the voltage at the node N2 can be closer to the supply voltage (e.g., VDD) than the voltage at the node N1 where the voltage at the node N1 can be closer to ground voltage (e.g., GND) than the voltage at the node N2.

At time t3 after the voltages at the nodes N1, N2 settle according to the programmed states of the MTJ devices 220A, 220B, the memory controller 105 may enable the transistors T3, T4 to sense voltages at the nodes N1, N2 through the bit lines BL, BLB, respectively for reading. According to the sensed voltages through the bit lines BL, BLB, the memory controller 105 may determine a programmed bit of the memory cell 125. For example, in response to the voltage sensed through the bit line BL being higher than the voltage sensed through the bit line BLB, the memory controller 105 may determine that the memory cell 125 stores a logic value '1'. For example, in response to the voltage sensed through the bit line BL being lower than the voltage sensed through bit line BLB, the memory controller 105 may determine that the memory cell 125 stores a logic value '0'.

Figure 5A:
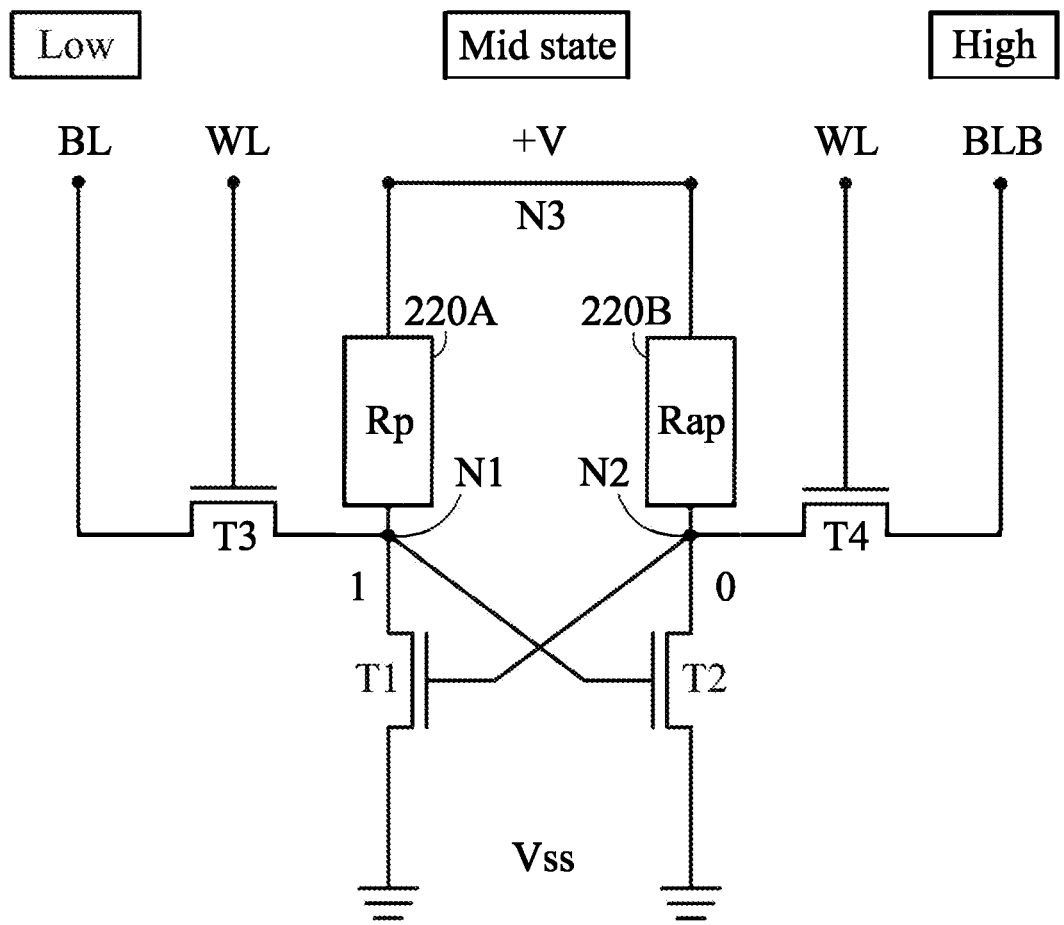
FIG. 5A is a schematic diagram of the memory cell of FIG. 2 storing a first state of a bit, in accordance with some embodiments.

FIG. 5A is a schematic diagram of the memory cell 125 storing a first state (e.g., logic value '1') of a bit, in accordance with some embodiments. The memory controller 105 may provide the low voltage (e.g., GND) to the node N1 and a reference voltage (e.g., ½ VDD) to the node N3 for a predetermined time period (e.g., 30 ns). According to the low voltage (e.g., GND) provided to the node N1 and the reference voltage (e.g., ½ VDD) applied to the node N3 for the predetermined time period, the MTJ device 220A may have a parallel state Rp with a low resistance. Meanwhile, the memory controller 105 may provide the high voltage (e.g., VDD) to the node N2 and the reference voltage (e.g., ½ VDD) to the node N3. According to the high voltage (e.g., VDD) provided to the node N2 and the reference voltage (e.g., ½ VDD) provided to the node N3 for the predetermined time period, the MTJ device 220B may have an anti-parallel state Rap with a high resistance. After setting or programming the states of the MTJ devices 220A, 220B by applying the voltages for a predetermined time period (e.g., 30 ns). For reading data, transistors T3, T4 may be disabled and a supply voltage (e.g., VDD) may be provided to the node N3. By providing the supply voltage and disabling the transistors T3, T4, voltages at the nodes N1, N2 may settle, according to the programmed states of the MTJ devices 220A, 220B. In the example shown in FIG. 5A, the voltage at the node N1 can be closer to the supply voltage (e.g., VDD) than the voltage at the node N2 and the voltage at the node N2 can be closer to the ground voltage (e.g., GND) than the voltage at the node N1, because the MTJ device 220A has a lower resistance than the MTJ device 220B. After the voltages at the nodes N1, N2 settle, the memory controller 105 may enable the transistors T3, T4 and sense voltages at the nodes N1, N2 through the bit lines BL, BLB, respectively for reading. In the example shown in FIG. 5A, the memory controller 105 may determine that the memory cell 125 stores a logic value '1', because the voltage sensed through the bit line BL is higher than the voltage sensed through the bit line BLB.

Figure 5B:
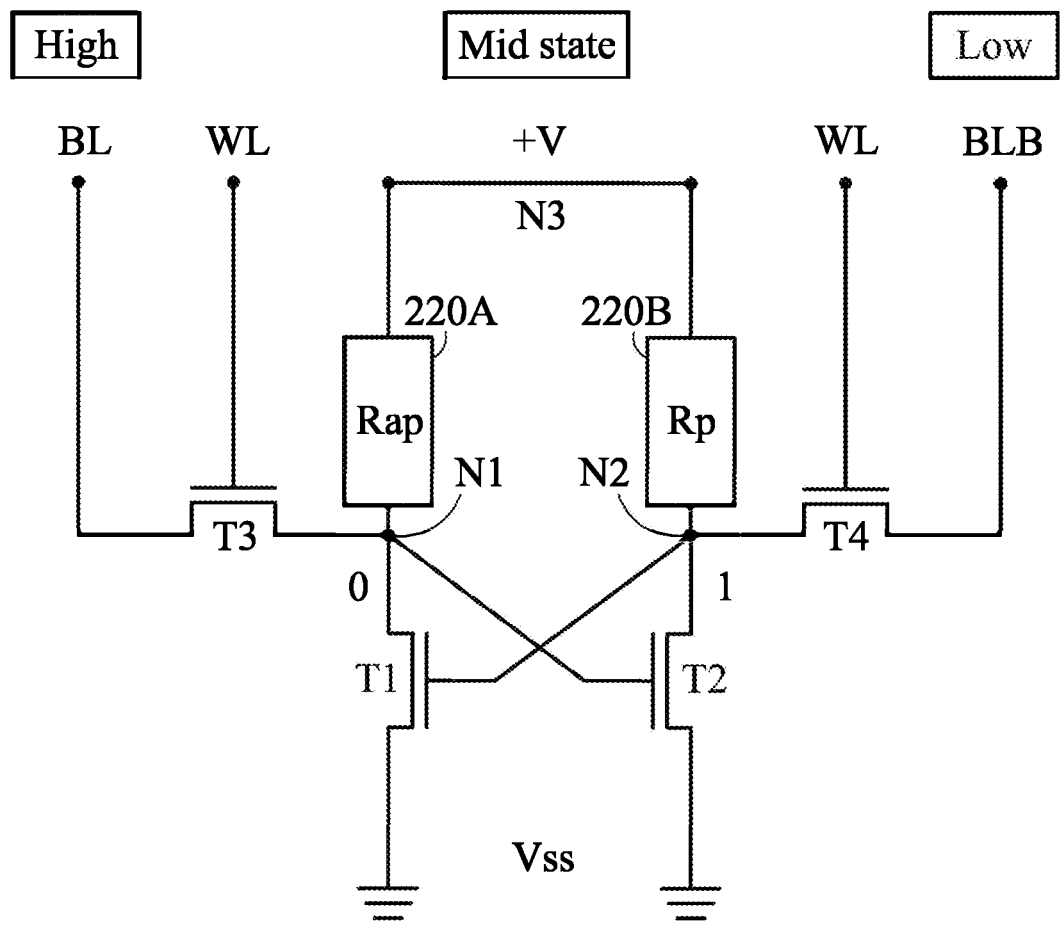
FIG. 5B is a schematic diagram of the memory cell of FIG. 2 storing a second state of a bit, in accordance with some embodiments.

FIG. 5B is a schematic diagram of the memory cell 125 of FIG. 2 storing a second state (e.g., logic value '0') of a bit, in accordance with some embodiments. The memory controller 105 may provide the high voltage (e.g., VDD) to the node N1 and a reference voltage (e.g., ½ VDD) to the node N3 for a predetermined time period (e.g., 30 ns). According to the high voltage (e.g., VDD) provided to the node N1 and the reference voltage (e.g., ½ VDD) applied to the node N3 for the predetermined time period, the MTJ device 220A may have an anti-parallel state Rap with a high resistance. Meanwhile, the memory controller 105 may provide the low voltage (e.g., GND) to the node N2 and the reference voltage (e.g., ½ VDD) to the node N3. According to the low voltage (e.g., GND) provided to the node N2 and the reference voltage (e.g., ½ VDD) provided to the node N3 for the predetermined time period, the MTJ device 220B may have a parallel state Rp with a low resistance. After setting or programming the states of the MTJ devices 220A, 220B by applying the voltages for a predetermined time period (e.g., 30 ns). For reading data, transistors T3, T4 may be disabled and a supply voltage (e.g., VDD) may be provided to the node N3. By providing the supply voltage and disabling the transistors T3, T4, voltages at the nodes N1, N2 may settle, according to the programmed states of the MTJ devices 220A, 220B. In the example shown in FIG. 5B, the voltage at the node N2 can be closer to the supply voltage (e.g., VDD) than the voltage at the node N1 and the voltage at the node N1 can be closer to the ground voltage (e.g., GND) than the voltage at the node N2, because the MTJ device 220B has a lower resistance than the MTJ device 220A. After the voltages at the nodes N1, N2 settle, the memory controller 105 may enable the transistors T3, T4 and sense voltages at the nodes N1, N2 through the bit lines BL, BLB, respectively for reading. In the example shown in FIG. 5B, the memory controller 105 may determine that the memory cell 125 stores a logic value '0', because the voltage sensed through the bit line BLB is higher than the voltage sensed through the bit line BL.

Figure 6:
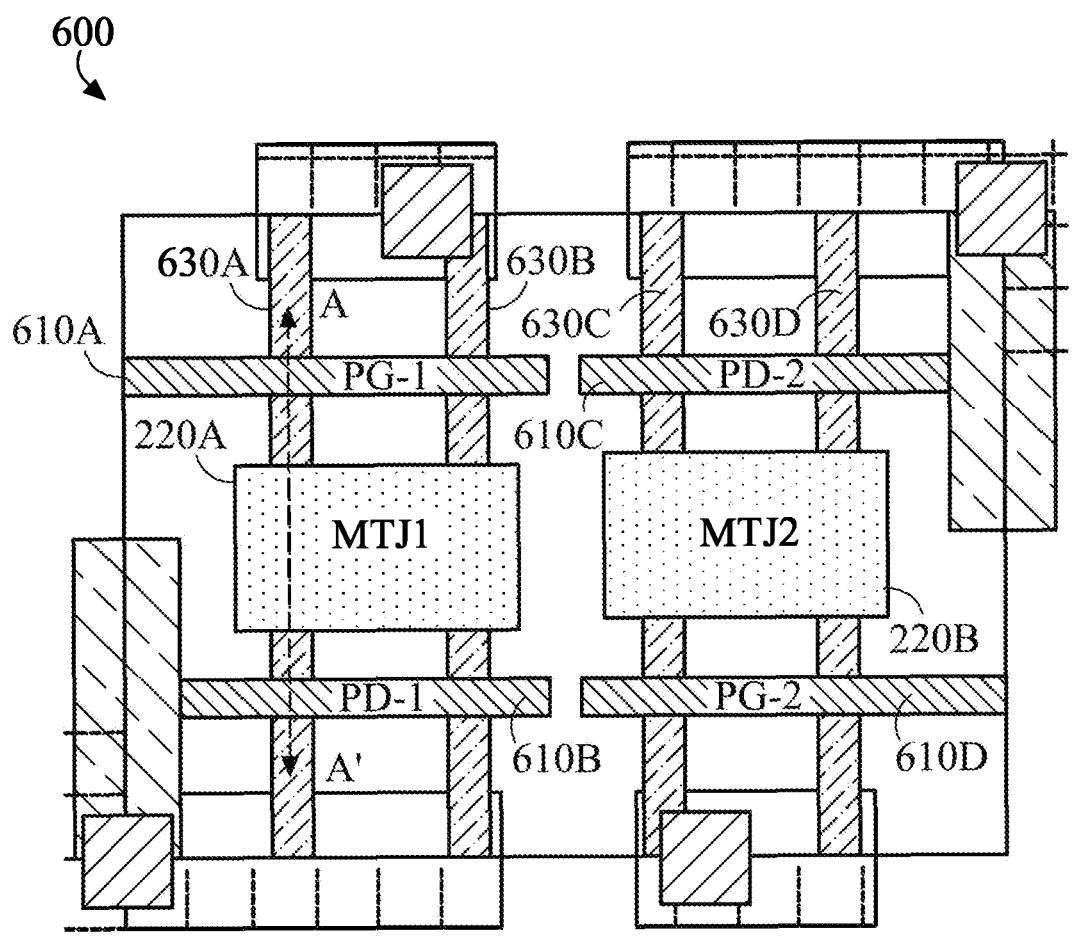
FIG. 6 is a top plan view of a memory cell with MTJ devices, in accordance with some embodiments.

FIG. 6 is a layout or a top plan view 600 of the memory cell 125 with MTJ devices 220A, 220B, in accordance with some embodiments. In some embodiments, the memory cell 125 includes gate structures 610A, 610B, 610C, 610D elongated along a X-direction, active regions 630A, 630B, 630C, 630D elongated along a Y-direction, and MTJ devices 220A, 220B. These components may be arranged and function as the memory cell 125 described above with respect to FIG. 6. In one aspect, the memory cell 125 includes more, fewer, or different components than shown in FIG. 6. For example, the memory cell 125 includes additional components (e.g., routing metals, via contacts) that are not shown in FIG. 6.

In some embodiments, transistors are formed where the gate structures 610A, 610B, 610C, 610D and active regions 630A, 630B, 630C, 630D intersect. The gate structures 610A, 610B, 610C, 610D may correspond to or include polysilicon or other conductive materials. The active regions 630A, 630B, 630C, 630D may include N-diffusion. For example, a transistor T1 is formed, at which the active regions 630A, 630B and the gate structure 610B intersect. For example, a transistor T3 is formed, at which the active regions 630A, 630B and the gate structure 610A intersect. For example, a transistor T2 is formed, at which the active regions 630C, 630D and the gate structure 610C intersect. For example, a transistor T4 is formed, at which the active regions 630C, 630D and the gate structure 610D intersect. In one example, the transistors T1 and T3 share drain structures in the active region 630A, 630B underneath the MTJ device 220A. In one example, the transistors T2 and T4 share drain structures in the active region 630C, 630D underneath the MTJ device 220B.

In one aspect, the MTJ devices 220A, 220B are disposed on a different layer than a layer of the transistors T1, T2, T3, T4. In one aspect, the MTJ devices 220A, 220B may partially overlap with the transistors T1, T2, T3, T4. For example, the MTJ device 220A is disposed above, or overlaps with the shared drain structure of the transistors T1, T3. For example, the MTJ device 220B is disposed above, or overlaps with the shared drain structure of the transistors T2, T4.

Advantageously, the memory cell 125 can be formed in an area efficient manner. In one aspect, by sharing the drain structures, the transistors T1, T2, T3, T4 can be formed in a compact area. Moreover, by obviating P-type transistors that generally consume larger areas than N-type transistors, the memory cell 125 can be formed in a smaller area. Furthermore, by forming the MTJ devices 220A, 220B above the shared drain structures of the transistors T1, T2, T3, T4, the transistors T1, T2, T3, T4 can be formed in a compact area to achieve area efficiency.

Figure 7:
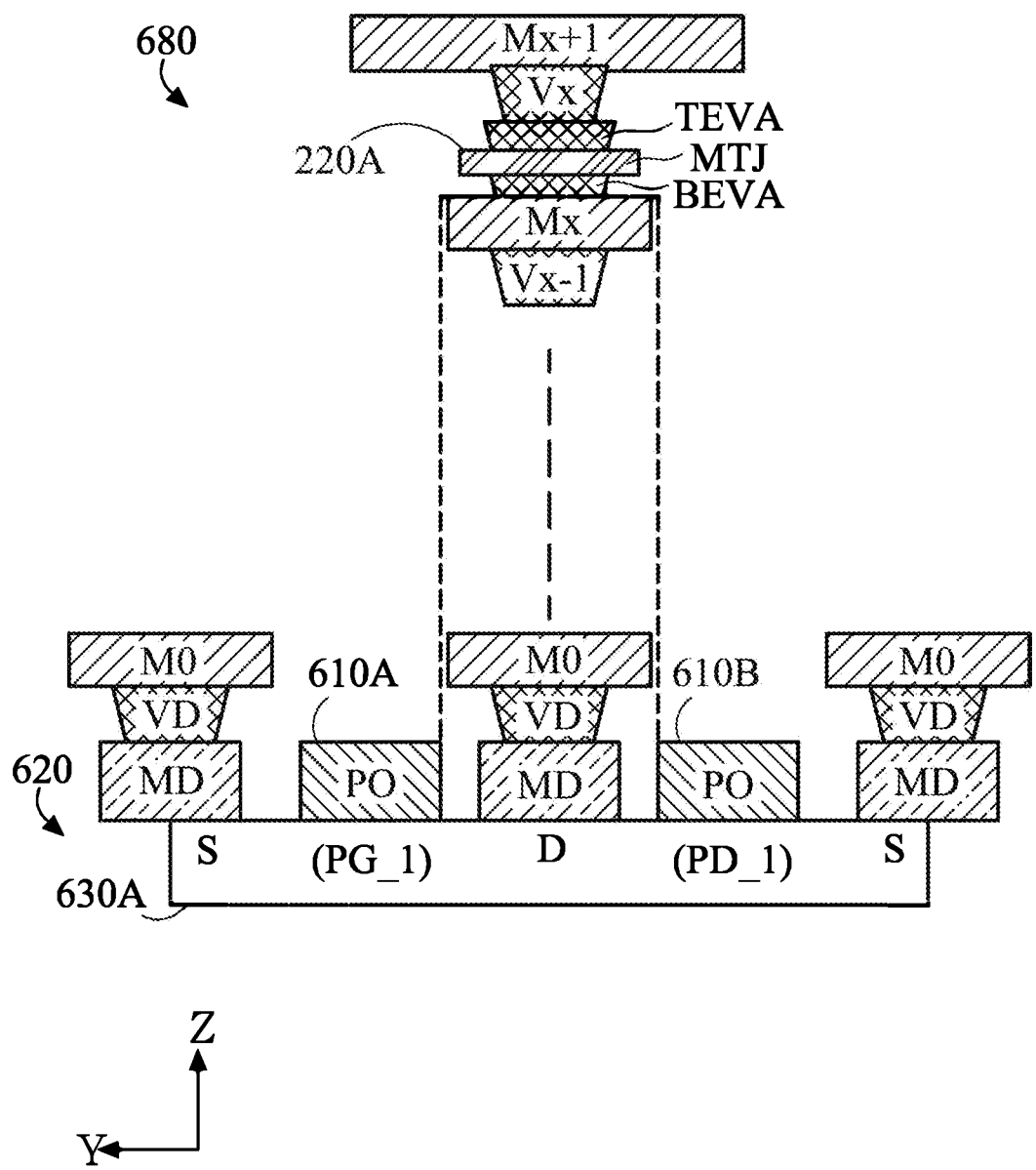
FIG. 7 is a cross-section diagram along a line A-A' of the memory cell in FIG. 6, in accordance with some embodiments.

FIG. 7 is a cross-section diagram along a line A-A' of the memory cell 125 in FIG. 6, in accordance with some embodiments. In one aspect, the active region 630A extends along the Y-direction. In a first layer 620, the transistor T3 may be formed where the gate structure 610A and the active region 630A intersect or overlap, and the transistor T1 may be formed where the gate structure 610B and the active region 630A intersect or overlap. As shown in FIG. 7, the transistors T1, T3 may share the drain structure D. The shared drain structure D may be or function as the node N1. In a second layer 680 above the first layer 620, the MTJ device 220A is formed above the shared drain structure D of the transistors T1, T3 along the Z-direction. In one configuration, the pinned layer structure 320 is disposed in a lower layer than the free layer structure 310. Hence, the pinned layer structure 320 of the MTJ device 220A can be electrically coupled to the drain structure D though via contacts (e.g., VD . . . Vx–1) and metal rails (M0 . . . Mx), and the free layer structure 310 of the MTJ device 220A can be electrically coupled to a metal rail Mx+1 through a via contact Vx. The metal rail Mx+1 may be or function as the node N3.

Figure 8:
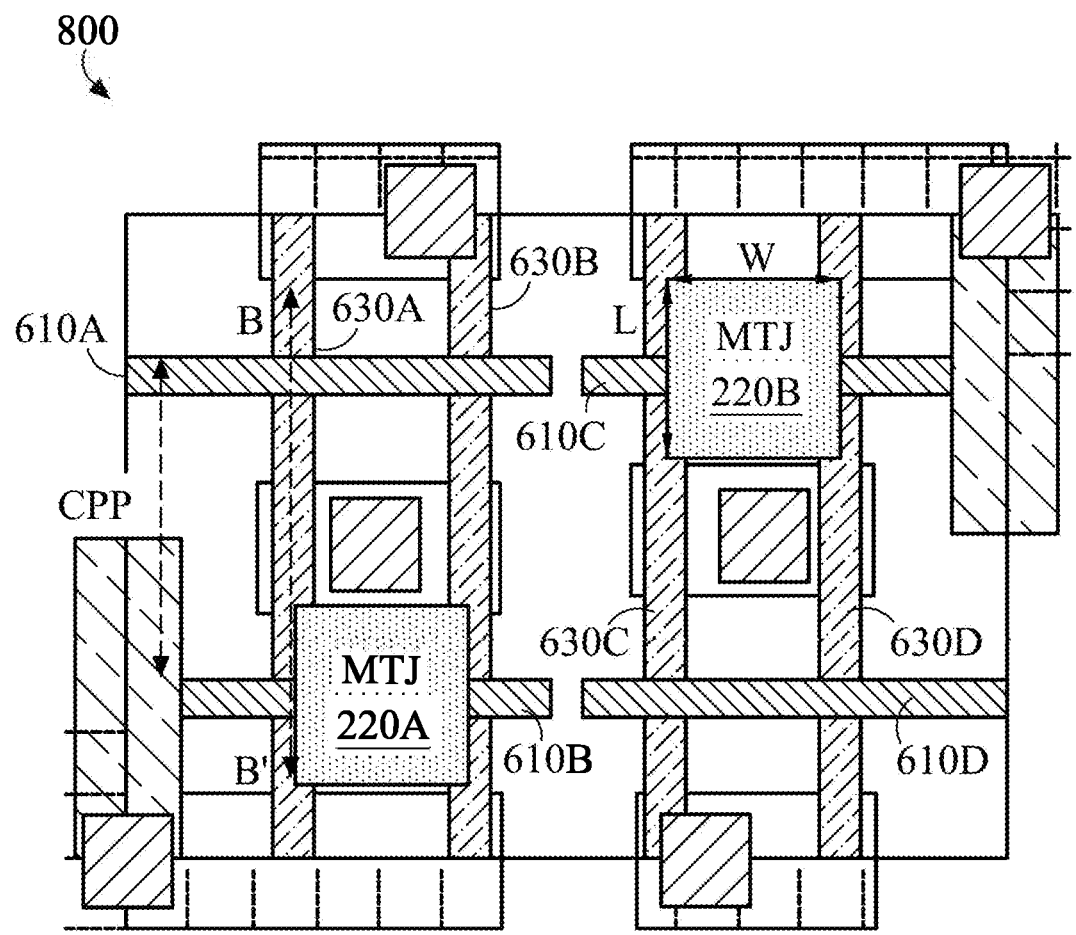
FIG. 8 is a top plan view of a memory cell with MTJ devices, in accordance with some embodiments.
Figure 9:
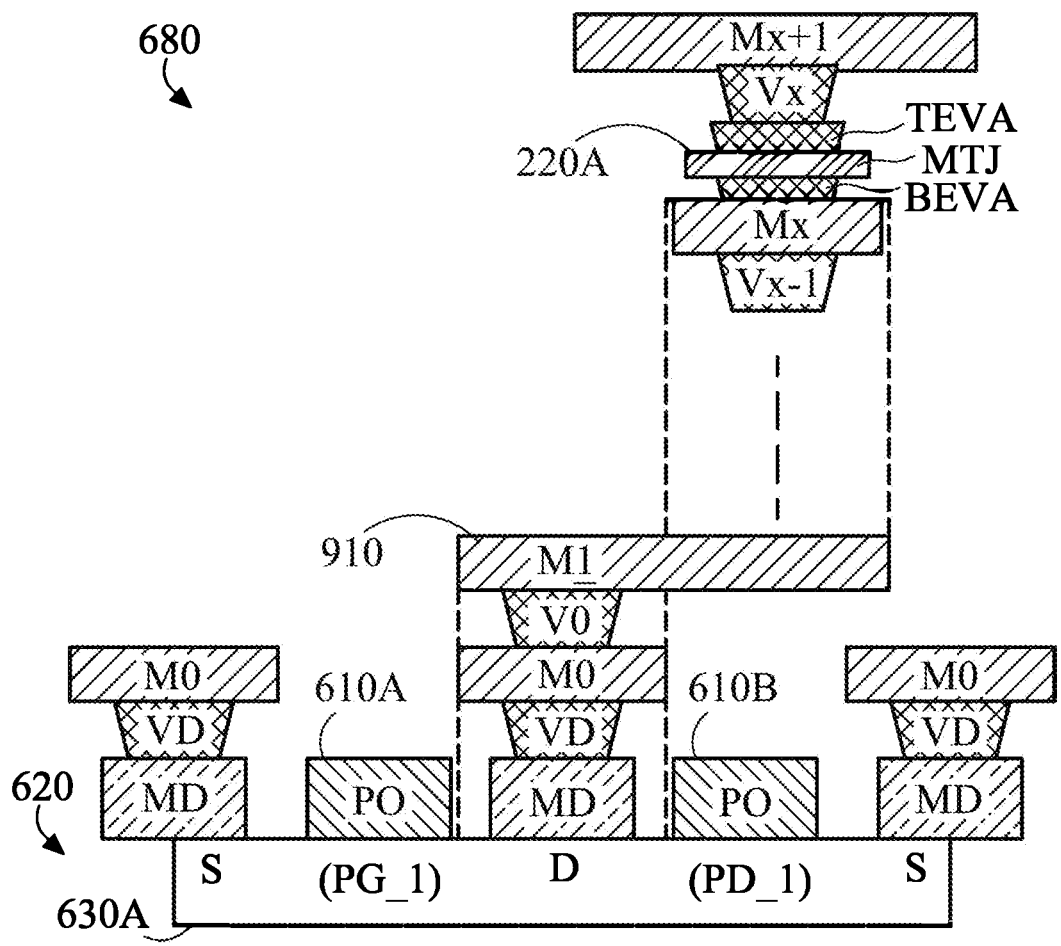
FIG. 9 is a cross-section diagram along a line B-B' of the memory cell in FIG. 8, in accordance with some embodiments.

FIG. 8 is a top plan 800 view of a memory cell 125 with MTJ devices 220A, 220B, in accordance with some embodiments. FIG. 9 is a cross-section diagram along a line B-B' of the memory cell 125 in FIG. 8, in accordance with some embodiments. In one aspect, the memory cell 125 shown in FIG. 8 is similar to the memory cell 125 shown in FIG. 6, except the MTJ devices 220A, 220B are disposed along a diagonal line traversing the X direction and the Y direction. In some embodiments, the MTJ devices 220A, 220B are disposed in metal 3 layer or a higher layer. A pinned layer structure of the MTJ device 220 may be electrically coupled to a drain structure D of a transistor through an interconnect 910 (e.g., metal 0 layer, metal 1 layer, or metal 2 layer) below the MTJ devices 220A, 220B. The interconnect 910 may extend along the Y-direction to overlap with the drain structure of the transistor T1 and the gate structure 610B of the transistor T1. In one example, the drain structure D of the transistor T1 is electrically connected to a first part of the interconnect 910 through a metal diffusion (MD), a via contact VD, a metal rail M0, and a via contact V0. In one example, a second part of the interconnect 910 is electrically connected to a pinned layer structure of the MTJ device 220A through the metal rails and via contacts between the interconnect 910 and the MTJ device 220A. By implementing the interconnect 910, the MTJ device 220A may be disposed above the gate structure 610B of the transistor T1 and the MTJ device 220B may be disposed above the gate structure 610C of the transistor T2.

Advantageously, a memory cell can be implemented in a compact manner while satisfying spacing rules or requirements (e.g., design rule checking (DRC)) by placing the MTJ devices 220A, 220B along the diagonal direction as shown in FIGS. 8 and 9. In one example, MTJ devices 220A, 220B separated by a distance less than a separation distance along the X-direction or the Y-direction may violate DRC. A separation distance may be 1.5-2 times the distance between two active regions 630. By implementing the MTJ devices 220A, 220B along the diagonal direction as shown in FIGS. 8 and 9, the MTJ devices 220A, 220B may be implemented within a rectangular area allocated for placing four transistors T1, T2, T3, T4, while satisfying the spacing rules or requirements.

In some embodiments, each MTJ device 220 has a width W along the X-direction and a length L along the Y-direction. The length L of each MTJ device 220 may be larger than a polypitch CPP but less than 1.5 times the polypitch CPP. A polypitch CPP may be a distance between a center of a first gate structure and a center of a second gate structure. By ensuring that the length L of the MTJ device 220 is less than 1.5 times the polypitch CPP, the diagonally located MTJ devices 220A, 220B may satisfy the spacing rules or requirements of the MTJ devices 220A, 220B. For example, by ensuring that the length L of each MTJ device 220A/220B is less than 1.5 times the polypitch CPP, a right end of the MTJ device 220A along the X-direction may not face a left end of the MTJ device 220B along the X-direction. Hence, the MTJ devices 220A, 220B can be disposed along the diagonal direction to achieve area efficiency.

Figure 10A:
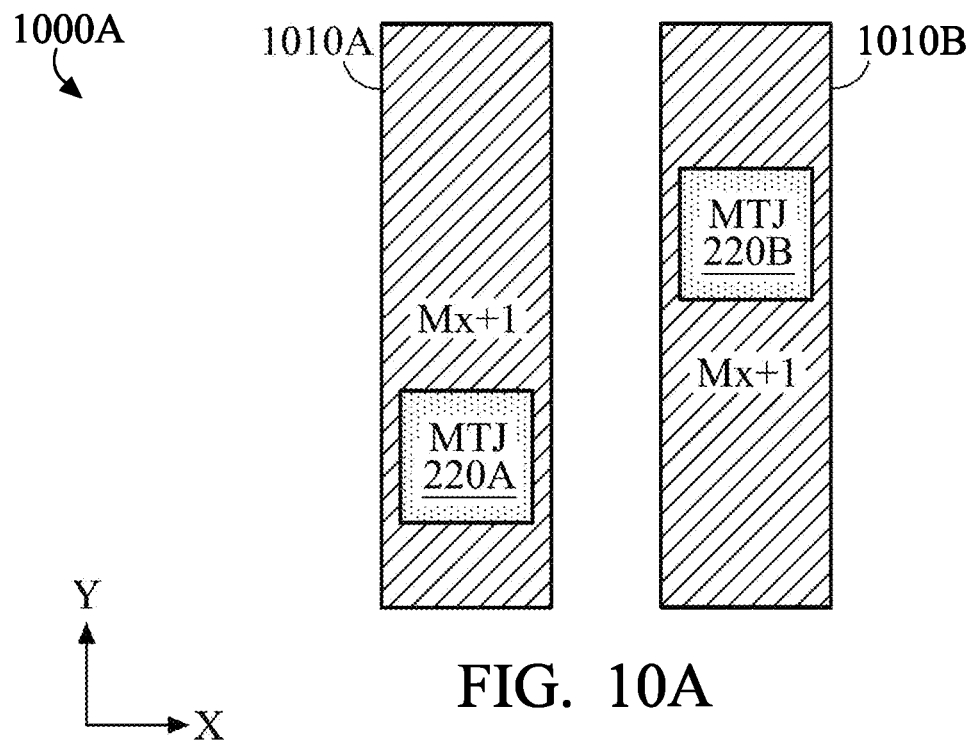
FIG. 10A is a top plan view of MTJ devices and power rails providing power to the MTJ devices, in accordance with some embodiments.
Figure 10B:
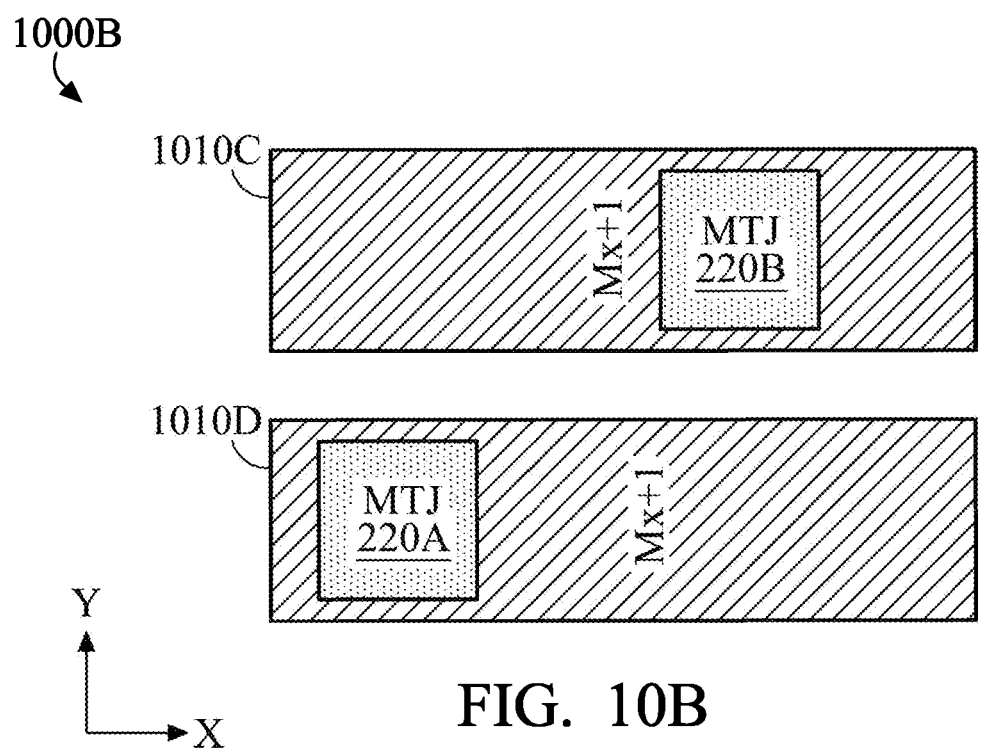
FIG. 10B is a top plan view of MTJ devices and power rails providing power to the MTJ devices, in accordance with some embodiments.

FIG. 10A is a top plan view 1000A of MTJ devices 220A, 220B and power rails 1010A, 1010B providing a reference voltage or a supply voltage to the MTJ devices 220A, 220B, in accordance with some embodiments. FIG. 10B is a top plan view 1000B of MTJ devices 220A, 220B and power rails 1010C, 1010D providing a reference voltage or a supply voltage to the MTJ devices 220A, 220B, in accordance with some embodiments. The power rails 1010 may constitute or function as the common node N3. In some embodiments, the power rails 1010A, 1010B may extend in the Y-direction as shown in FIG. 10A. The power rail 1010A may be electrically connected to a free layer structure of the MTJ device 220A, and the power rail 1010B may be electrically connected to a free layer structure of the MTJ device 220B. In some embodiments, the power rails 1010C, 1010D may extend in the X-direction as shown in FIG. 10B. In one aspect, the power rails 1010 may extend in the direction associated with a particular layer. For example, the power rails 1010 may extend in the X-direction for an even numbered layer (e.g., M4, M6, M8) or extend in the Y-direction for odd numbered layer (e.g., M3, M5, M7). In some embodiments, the metal rails 1010A, 1010B may be replaced by a single metal rail having a width sufficient to cover or overlap the MTJ devices 220A, 220B, such that a reference voltage or a supply voltage can be provided to the free layer structures of the MTJ devices 220A, 220B with low resistance.

FIG. 11 is a flowchart of a method 1100 of writing data to the memory cell 125 with MTJ devices 220A, 220B, in accordance with some embodiments. The method 1100 may be performed by the memory controller 105 of FIG. 1. In some embodiments, the method 1100 is performed by other entities. In some embodiments, the method 1100 includes more, fewer, or different operations than shown in FIG. 11.

In an operation 1110, the memory controller 105 configures the transistors T3, T4 to couple the first bit line BL to a first node N1 and couple the second bit line BLB to a second node N2. In one approach, the memory controller 105 generates and applies a high voltage (e.g., VDD) to a word line WL coupled to the gate structures of the transistors T3, T4 to enable the transistors T3, T4.

In an operation 1120, the memory controller 105 applies a first voltage to the first node N1 through the first bit line. In an operation 1130, the memory controller 105 applies a second voltage to the second node N2 through the second bit line. In an operation 1140, the memory controller 105 applies a reference voltage to the third node N3. In one approach, the memory controller 105 applies a low voltage (e.g., GND) to the bit line BL while applying the high voltage (e.g., VDD) to the bit line BLB and the reference voltage (e.g., ½ VDD) to the node N3 to store a logic value '1'. In one approach, the memory controller 105 applies a high voltage (e.g., VDD) to the bit line BL while applying the low voltage (e.g., GND) to the bit line BLB and the reference voltage (e.g., ½ VDD) to the node N3 to store a logic value '0'. After applying the voltages for the predetermined time period (e.g., 30 ns), the states of the MTJ devices 220A, 220B may be set or programmed. For example, if the low voltage (e.g., GND) is applied to the node N1 and the high voltage (e.g., VDD) is applied to the node N2 while the reference voltage (e.g., ½ VDD or 0.5V) is applied to the node N3, the MTJ device 220A may be set or programmed to have a parallel state Rp and the MTJ device 220B may be set or programmed to have an anti-parallel state Rap. For example, if the high voltage (e.g., VDD) is applied to the node N1 and the low voltage (e.g., GND) is applied to the node N2 while the reference voltage (e.g., ½ VDD or 0.5V) is applied to the node N3, the MTJ device 220A may be set or programmed to have an anti-parallel state Rap and the MTJ device 220B may be set or programmed to have a parallel state Rp.

In an operation 1150, the memory controller 105 decouples the first bit line BL from the first node N1 and the second bit line BLB from the second node N2. In one approach, the memory controller 105 generates and applies a low voltage (e.g., GND) to the word line WL coupled to the gate structures of the transistors T3, T4 to disable the transistors T3, T4. The memory controller 105 may apply a low voltage (e.g., GND) to the common node N3 to power off the memory cell 125. In one aspect, the MTJ devices 220A, 220B may retain data without power.

To read data stored by the memory cell 125, the memory controller 105 may apply a supply voltage (e.g., VDD) to the node N3, while the transistors T3, T4 are disabled. By applying the supply voltage (e.g., VDD) to the node N3, voltages at the nodes N1, N2 may be set, according to the programmed states of the MTJ devices 220A, 220B. For example, if the MTJ device 220A has a lower resistance than the MTJ device 220B, the voltage at the node N1 can be closer to the supply voltage (e.g., VDD) than the voltage at the node N2 where the voltage at the node N2 can be closer to the ground voltage (e.g., GND) than the voltage at the node N1. For example, if the MTJ device 220B has a lower resistance than the MTJ device 220A, the voltage at the node N2 can be closer to the supply voltage (e.g., VDD) than the voltage at the node N1 where the voltage at the node N1 can be closer to the ground voltage (e.g., GND) than the voltage at the node N2. After the voltages at the nodes N1, N2 settle, the memory controller 105 may enable the transistors T3, T4 to sense voltages at the nodes N1, N2 and determine data stored by the memory cell 125 according to the sensed voltages.

Advantageously, the disclosed memory cell 125 provides several benefits. In one aspect, the memory cell 125 bypasses or omits P-type transistors, but instead includes or implements N-type transistors with MTJ devices 220 in different layers in a partially or wholly overlapping manner. Accordingly, area efficiency can be achieved by obviating P-type transistors that are larger than N-type transistors. Moreover, power efficiency can be achieved, because leakage current through P-type transistors can be obviated. In addition, the MTJ devices 220 can store bits or data without power, such that the memory cell 125 can operate or function as a non-volatile memory cell.

Figure 12:
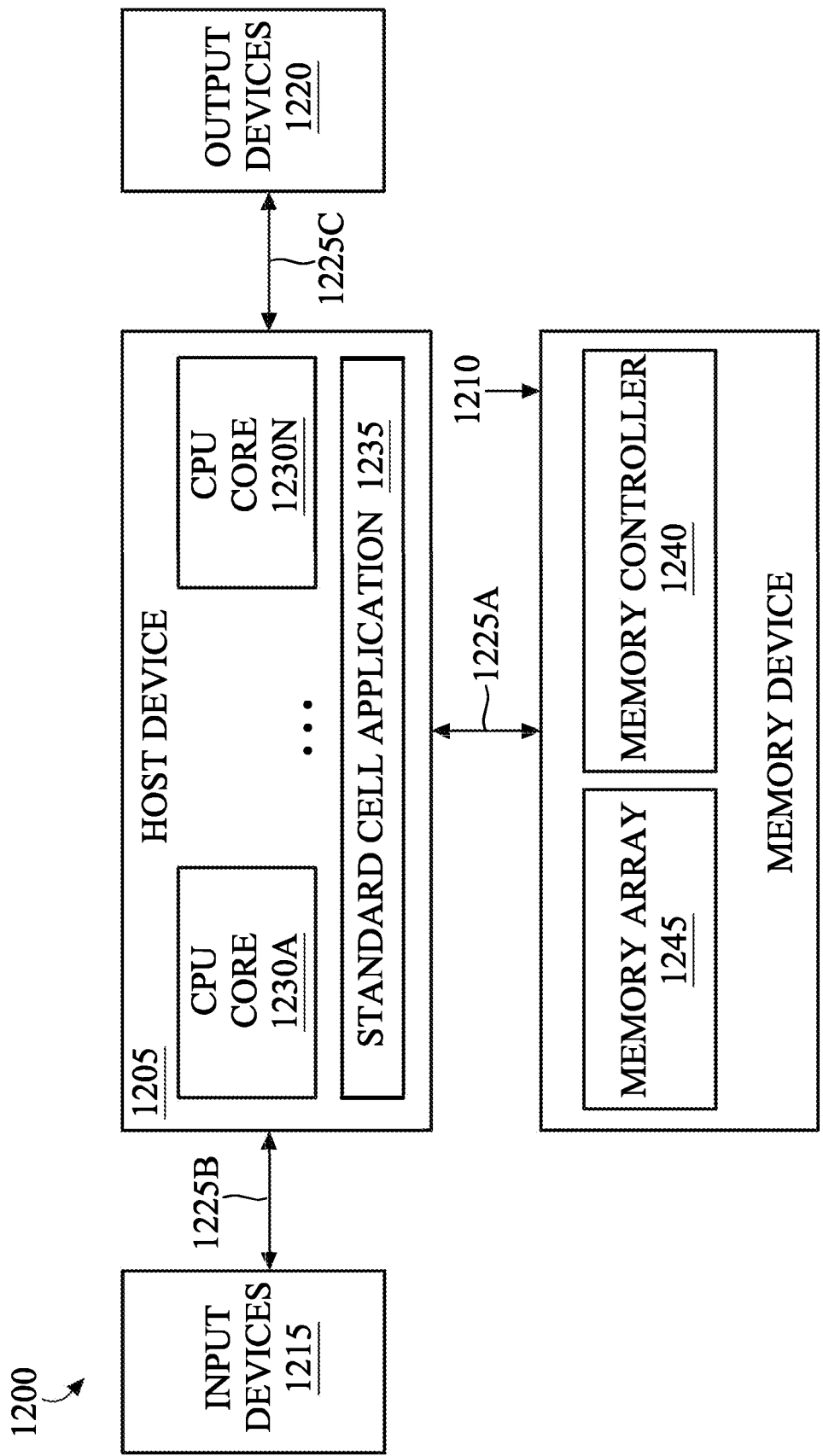
FIG. 12 is an example block diagram of a computing system, in accordance with some embodiments.

Referring now to FIG. 12, an example block diagram of a computing system 1200 is shown, in accordance with some embodiments of the disclosure. The computing system 1200 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1200 includes a host device 1205 associated with a memory device 1210. The host device 1205 may be configured to receive input from one or more input devices 1215 and provide output to one or more output devices 1220. The host device 1205 may be configured to communicate with the memory device 1210, the input devices 1215, and the output devices 1220 via appropriate interfaces 1225A, 1225B, and 1225C, respectively. The computing system 1200 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1205.

The input devices 1215 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1205 and that allows an external source, such as a user (e.g., a circuit or layout designer), to enter information (e.g., data) into the host device and send instructions to the host device. Similarly, the output devices 1220 may include a variety of output technologies such as external memories, printers, speakers, displays, microphones, light emitting diodes, headphones, video devices, and any other output peripherals that are configured to receive information (e.g., data) from the host device 1205. The "data" that is either input into the host device 1205 and/or output from the host device may include any of a variety of textual data, circuit data, signal data, semiconductor device data, graphical data, combinations thereof, or other types of analog and/or digital data that is suitable for processing using the computing system 1200.

The host device 1205 includes or is associated with one or more processing units/processors, such as Central Processing Unit ("CPU") cores 1230A-1230N. The CPU cores 1230A-1230N may be implemented as an Application Specific Integrated Circuit ("ASIC"), Field Programmable Gate Array ("FPGA"), or any other type of processing unit. Each of the CPU cores 1230A-1230N may be configured to execute instructions for running one or more applications of the host device 1205. In some embodiments, the instructions and data to run the one or more applications may be stored within the memory device 1210. The host device 1205 may also be configured to store the results of running the one or more applications within the memory device 1210. Thus, the host device 1205 may be configured to request the memory device 1210 to perform a variety of operations. For example, the host device 1205 may request the memory device 1210 to read data, write data, update or delete data, and/or perform management or other operations. One such application that the host device 1205 may be configured to run may be a standard cell application 1235. The standard cell application 1235 may be part of a computer aided design or electronic design automation software suite that may be used by a user of the host device 1205 to use, create, or modify a standard cell of a circuit. In some embodiments, the instructions to execute or run the standard cell application 1235 may be stored within the memory device 1210. The standard cell application 1235 may be executed by one or more of the CPU cores 1230A-1230N using the instructions associated with the standard cell application from the memory device 1210. In one example, the standard cell application 1235 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 12, the memory device 1210 includes a memory controller 1240 that is configured to read data from or write data to a memory array 1245. The memory array 1245 may include a variety of volatile and/or non-volatile memories. For example, in some embodiments, the memory array 1245 may include NAND flash memory cores. In other embodiments, the memory array 1245 may include NOR flash memory cores, SRAM cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1245 may be individually and independently controlled by the memory controller 1240. In other words, the memory controller 1240 may be configured to communicate with each memory within the memory array 1245 individually and independently. By communicating with the memory array 1245, the memory controller 1240 may be configured to read data from or write data to the memory array in response to instructions received from the host device 1205. Although shown as being part of the memory device 1210, in some embodiments, the memory controller 1240 may be part of the host device 1205 or part of another component of the computing system 1200 and associated with the memory device. The memory controller 1240 may be implemented as a logic circuit in either software, hardware, firmware, or combination thereof to perform the functions described herein. For example, in some embodiments, the memory controller 1240 may be configured to retrieve the instructions associated with the standard cell application 1235 stored in the memory array 1245 of the memory device 1210 upon receiving a request from the host device 1205.

It is to be understood that only some components of the computing system 1200 are shown and described in FIG. 12. However, the computing system 1200 may include other components such as various batteries and power sources, networking interfaces, routers, switches, external memory systems, controllers, etc. Generally speaking, the computing system 1200 may include any of a variety of hardware, software, and/or firmware components that are needed or considered desirable in performing the functions described herein. Similarly, the host device 1205, the input devices 1215, the output devices 1220, and the memory device 1210 including the memory controller 1240 and the memory array 1245 may include other hardware, software, and/or firmware components that are considered necessary or desirable in performing the functions described herein.

One aspect of this description relates to a memory cell. In some embodiments, the memory cell includes a first layer including a first transistor and a second transistor. In some embodiments, the first transistor and the second transistor are connected to each other in a cross-coupled configuration. In some embodiments, a first drain structure of the first transistor is electrically coupled to a first gate structure of the second transistor. In some embodiments, a second drain structure of the second transistor is electrically coupled to a second gate structure of the first transistor. In some embodiments, the memory cell includes a second layer including a first magnetic tunnel junction (MTJ) device electrically coupled to the first drain structure of the first transistor and a second MTJ device electrically coupled to the second drain structure of the second transistor. In some embodiments, the second layer is above the first layer.

One aspect of this description relates to a memory system. In some embodiments, the system includes a memory cell including cross-coupled transistors electrically coupled to a first node and a second node. In some embodiments, the memory cell includes a first magnetic tunnel junction (MTJ) device coupled between a common node and the first node. In some embodiments, the memory cell includes a second MTJ device coupled between the common node and the second node. In some embodiments, the first MTJ device is disposed above a part of the cross-coupled transistors. In some embodiments, the second MTJ device is disposed above another part of the cross-coupled transistors. In some embodiments, the system includes a memory controller coupled to the memory cell. In some embodiments, the memory controller programs the memory cell. In some embodiments, programming the memory cell includes applying a first voltage to the first node. In some embodiments, programming the memory cell includes applying a second voltage to the second node while the first voltage is applied to the first node. In some embodiments, programming the memory cell includes applying a reference voltage to the common node while the first voltage is applied to the first node and the second voltage is applied to the second node.

One aspect of this description relates to a SRAM cell. In some embodiments, the SRAM cell includes a first MTJ device comprising a free layer structure, a barrier layer structure, and a pinned layer structure. In some embodiments, the SRAM cell includes a first pass-gate transistor coupled between a bit line and the pinned layer structure of the first MTJ device. In some embodiments, the SRAM cell includes a first pull-down transistor coupled between a ground and the pinned layer structure of the first MTJ device. In some embodiments, the free layer structure of the first MTJ device is coupled to a power line.

One aspect of this description relates to a method of operating a memory cell. In some embodiments, the method includes applying, by a memory controller, a first voltage to a first pinned layer structure of a first magnetic tunnel junction (MTJ) device of the memory cell. In some embodiments, the method includes applying, by the memory controller, a second voltage to a second pinned layer structure of a second MTJ device of the memory cell, while the first voltage is applied to the first pinned layer structure of the first MTJ device. The first pinned layer structure and the second pinned layer structure may be coupled to the cross-coupled transistors. In some embodiments, the method includes applying, by the memory controller, a reference voltage to a first free layer structure of the first MTJ device and a second free layer structure of the second MTJ device, while the first voltage is applied to the first pinned layer structure of the first MTJ device and the second voltage is applied to the second pinned layer structure of the second MTJ device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a first layer including a first transistor and a second transistor, wherein the first transistor and the second transistor are connected to each other in a cross-coupled configuration, wherein a first drain structure of the first transistor is electrically coupled to a first gate structure of the second transistor, wherein a second drain structure of the second transistor is electrically coupled to a second gate structure of the first transistor, wherein the first transistor and the second transistor are N-type transistors, wherein the memory cell does not include a P-type transistor; and
   a second layer including a first magnetic tunnel junction (MTJ) device electrically coupled to the first drain structure of the first transistor and a second MTJ device electrically coupled to the second drain structure of the second transistor, wherein the second layer is above the first layer,
   wherein the first MTJ device is electrically coupled between the first drain structure of the first transistor and a common node, at which a reference voltage is applied, and
   wherein the second MTJ device is electrically coupled between the second drain structure of the second transistor and the common node.

2. The memory cell of claim 1,
   wherein the first MTJ device is disposed above the first drain structure of the first transistor, and
   wherein the second MTJ device is disposed above the second drain structure of the second transistor.

3. The memory cell of claim 1,
   wherein the first MTJ device is disposed above the second gate structure of the first transistor, and
   wherein the second MTJ device is disposed above the first gate structure of the second transistor.

4. The memory cell of claim 1, wherein the first MTJ device includes:
   a pinned layer structure electrically coupled to the first drain structure of the first transistor, and
   a free layer structure electrically coupled to the common node.

5. The memory cell of claim 4, wherein the second MTJ device includes:
   a pinned layer structure electrically coupled to the second drain structure of the second transistor, and
   a free layer structure electrically coupled to the common node.

6. The memory cell of claim 4, wherein the pinned layer structure is disposed closer to the first transistor than the free layer structure.

7. The memory cell of claim 1,
   wherein the first layer further includes a third transistor and a fourth transistor,
   wherein the third transistor is electrically coupled between a first bit line and the first drain structure of the first transistor, and wherein the fourth transistor is electrically coupled between a second bit line and the second drain structure of the second transistor.

8. The memory cell of claim 7, wherein the third transistor, and the fourth transistor are N-type transistors.

9. The memory cell of claim 7, wherein a third gate structure of the third transistor is electrically coupled to a word line, wherein a fourth gate structure of the fourth transistor is electrically coupled to the word line.

10. The memory cell of claim 7,
wherein the first transistor and the third transistor share the first drain structure, and
wherein the second transistor and the fourth transistor share the second drain structure.

11. A system comprising:
a memory cell including:
cross-coupled transistors electrically coupled to a first node and a second node, wherein the cross-coupled transistors are N-type transistors, wherein the memory cell does not include a P-type transistor,
a first magnetic tunnel junction (MTJ) device coupled between a common node and the first node, and
a second MTJ device coupled between the common node and the second node, wherein the first MTJ device is disposed above a part of the cross-coupled transistors, wherein the second MTJ device is disposed above another part of the cross-coupled transistors; and
a memory controller coupled to the memory cell, wherein the memory controller is to program the memory cell by:
applying a first voltage to the first node,
applying a second voltage to the second node while the first voltage is applied to the first node, and
applying a reference voltage to the common node while the first voltage is applied to the first node and the second voltage is applied to the second node.

12. The system of claim 11, wherein the first MTJ device is above a first drain structure of a first transistor of the cross-coupled transistors, wherein the second MTJ device is above a second drain structure of a second transistor of the cross-coupled transistors.

13. The system of claim 11, wherein the first MTJ device is above a first gate structure of a first transistor of the cross-coupled transistors, wherein the second MTJ device is above a second gate structure of a second transistor of the cross-coupled transistors.

14. The system of claim 11,
wherein the first MTJ device includes:
a first pinned layer structure electrically coupled to a first drain structure of a first transistor of the cross-coupled transistors, and
a first free layer structure electrically coupled to the common node, and wherein the second MTJ device includes:
a second pinned layer structure electrically coupled to a second drain structure of a second transistor of the cross-coupled transistors, and
a second free layer structure electrically coupled to the common node.

15. The system of claim 14, wherein the first pinned layer structure of the first MTJ device is disposed closer to the first transistor than the first free layer structure of the first MTJ device, wherein the second pinned layer structure of the second MTJ device is disposed closer to the second transistor than the second free layer structure of the second MTJ device.

16. The system of claim 14,
wherein the memory cell further includes:
a third transistor electrically coupled between a first bit line and the first node, and
a fourth transistor electrically coupled between a second bit line and the second node, and
wherein the memory controller is to:
apply the first voltage to the first node through the first bit line and the third transistor, and
apply the second voltage to the second node through the second bit line and the fourth transistor.

17. A method of operating a memory cell comprising:
applying, by a memory controller, a first voltage to a first pinned layer structure of a first magnetic tunnel junction (MTJ) device of the memory cell;
applying, by the memory controller, a second voltage to a second pinned layer structure of a second MTJ device of the memory cell, while the first voltage is applied to the first pinned layer structure of the first MTJ device, wherein the first pinned layer structure and the second pinned layer structure are coupled to cross-coupled transistors, wherein the cross-coupled transistors are N-type transistors, wherein the memory cell does not include a P-type transistor; and
applying, by the memory controller, a reference voltage to a first free layer structure of the first MTJ device and a second free layer structure of the second MTJ device, while the first voltage is applied to the first pinned layer structure of the first MTJ device and the second voltage is applied to the second pinned layer structure of the second MTJ device.

18. The method of claim 17, wherein the first voltage is applied to the first pinned layer structure of the first MTJ device through a first bit line and a first transistor electrically coupled to one of the cross-coupled transistors, and wherein the second voltage is applied to the second pinned layer structure of the second MTJ device through a second bit line and a second transistor electrically coupled to the other one of the cross-coupled transistors.

19. The method of claim 17, wherein the first voltage is higher than the reference voltage, wherein the reference voltage is higher than the second voltage.

20. The memory cell of claim 1, wherein to program the memory cell:
a first voltage is applied to the first drain structure of the first transistor,
a second voltage is applied to the second drain structure of the second transistor, and
the reference voltage is applied to the common node,
wherein the first voltage is higher than the reference voltage, wherein the reference voltage is higher than the second voltage.

* * * * *